United States Patent
Marion

(10) Patent No.: US 8,272,556 B2
(45) Date of Patent: Sep. 25, 2012

(54) METAL LIP SEAL AND MACHINE FITTED WITH SAME SEAL

(75) Inventor: Francois Marion, Saint-Martin le Vinoux (FR)

(73) Assignee: Commissariat a l'Energie Atomique, Paris (FR)

( * ) Notice: Subject to any disclaimer, the term of this patent is extended or adjusted under 35 U.S.C. 154(b) by 35 days.

(21) Appl. No.: 12/722,793

(22) Filed: Mar. 12, 2010

(65) Prior Publication Data
US 2010/0243713 A1 Sep. 30, 2010

(30) Foreign Application Priority Data
Mar. 30, 2009 (FR) ..................................... 09 51955

(51) Int. Cl.
*B23K 101/36* (2006.01)
(52) U.S. Cl. .................. 228/44.3; 228/178; 228/186
(58) Field of Classification Search .................. 228/178, 228/186, 44.3
See application file for complete search history.

(56) References Cited

U.S. PATENT DOCUMENTS

| 2,666,723 | A | * | 1/1954 | Stewart | 148/580 |
| 3,873,166 | A | * | 3/1975 | Berg et al. | 384/146 |
| 4,502,663 | A |   | 3/1985 | Huber |  |
| 5,968,389 | A |   | 10/1999 | Marion et al. |  |
| 6,454,015 | B1 | * | 9/2002 | Armstrong et al. | 166/387 |
| 2005/0248095 | A1 |   | 11/2005 | Olberding et al. |  |

FOREIGN PATENT DOCUMENTS
EP 0 795 891 A2 9/1997
* cited by examiner

*Primary Examiner* — Kiley Stoner
*Assistant Examiner* — Erin Saad
(74) *Attorney, Agent, or Firm* — Burr & Brown

(57) ABSTRACT

This metal lip seal capable of ensuring tightness between two elements includes: two resilient members each intended to be accommodated in a cavity of one of the two elements, said cavities being located in line with a zone of engagement of the two elements one with the other in which tightness is desired; and a flexible body secured to the element receiving the resilient members, provided with two free ends, said free ends extending at least in line with said engagement zones and being in contact with the resilient members. Each of the resilient members is capable of exerting a contact force on the free ends in order to ensure tightness between the two elements.

10 Claims, 2 Drawing Sheets

A-A

METAL LIP SEAL AND MACHINE FITTED WITH SAME SEAL

FIELD OF THE INVENTION

The invention relates to the field of metal lip seals, capable of ensuring tightness particularly at high temperatures and in a controlled atmosphere. It falls more specifically within the area of the hybridization of electronic or electro-optic components in the production of detectors.

DESCRIPTION OF THE PRIOR ART

In machines that use controlled atmosphere chambers, these chambers can be made leak-free by using seals to maintain the requisite pressure inside these chambers.

For example, in document U.S. Pat. No. 5,968,389, a hybridization unit is described that allows a component to be welded onto a substrate by means of micro-beads. This unit employs a bell-jar, inside which a controlled atmosphere is established, so that an assembly constituted by the substrate, the micro-beads and the component can move vertically, such that said assembly may or may not be brought into contact with the heating sole plate of an oven, while reducing the reasons for the component to be misaligned relative to the substrate. To be more precise, the substrate is kept sealed against the end of the lower part of the bell jar by negative pressure applied on the periphery of the substrate.

The assembly constituted by the substrate, the component and the micro-beads are thus able to be moved and in particular to be kept uncoupled from the sole plate long enough, for example, to pre-heat the sole plate to the fusion temperature of the micro-beads.

The substrate may be fitted on the periphery with a seal that comes into contact with the lower part of the bell-jar which is in contact with the substrate, to ensure that the controlled atmosphere internal chamber is kept leak tight. Additionally, the seal compensates for any lack of parallelism that may exist between the substrate and the lower part of the bell-jar.

In the units used in the semi-conductor industry field, such as plasma etching machines or vacuum deposition machines, there is a known technique of using seals made out of flexible polymers (for example the Kalrez® or Perlast® branded seals) in order to obtain good compression and a maximized contact surface between the seal and the element to be kept leak tight.

However, the temperature at which these seals can be used is limited to 330° C. for exposures of 30 to 300 seconds at such temperatures, and in no case are these seals able to withstand temperatures above 330° C.

In fact in some applications, such as those described above, when the substrate carrying the component is brought into contact with the pre-heated sole plate, the rise in temperature by heat transfer is extremely fast. The substrate and the seal are therefore rapidly subjected to a high temperature which may reach 400° C., or even 500° C.

One solution to this problem might comprise using a metal seal in the form of a ring-shaped tube. However, this solution is effective only when it is possible to tighten the seal mechanically, in other words to apply sufficient force to ensure the contact of the seal with the lower part of the wall in order to allow the seal to conform in shape to the bell-jar.

It is also possible to use O-ring seals fitted with a spring (for example seals with a Tamshell® spring), said spring being fitted into the toroid, in order to increase the contact force of the seal with the bell-jar, while retaining the flexibility properties of the seal in order to allow the seal to conform in shape to any surface unevenness.

However, to use spring seals of this kind, a bearing force is required that in particular allows the seal to be compressed on the bell jar and is greater than 60 newtons per linear millimeter of seal in order to ensure for example vacuum tightness, this minimum bearing force being required in particular to compress the seal by 20% so that it conforms in shape to the lower part of the bell jar and ensures good tightness.

In fact in some applications, and particularly in those described previously, the bearing force of the bell jar does not exceed 5 newtons per millimeter. The solution previously outlined is not therefore appropriate to provide a sufficient degree of seal compression in the event of the seal self-sustained by the vacuum coming under pressure. Indeed, the seal will not be sufficiently compressed to allow a proper vacuum to be established in the bell-jar.

Additionally, one of the drawbacks related to the use of seals working under stress lies in the fact that the contact surface of the seal with the bell jar walls is reduced, and does not allow the seal to conform in shape to the lower part of the bell-jar, and consequently, does not guarantee the requisite tightness.

In this context, the purpose of the present invention is to propose a metal lip seal that is free from at least one of the aforementioned limitations. To be more specific, the present invention is aimed in particular at finding a solution capable of ensuring the tightness of a part, that is resistant to high temperatures, rising in particular to 400° C. or even 500° C., capable of ensuring good tightness even with a bearing force not exceeding 60 newtons per millimeter, and offering a large contact surface.

OBJECT OF THE INVENTION

To this end, the object of the invention is a metal lip seal, capable of ensuring tightness between two elements. According to the invention, this seal includes:

two resilient members each intended to be accommodated in a cavity of one of the two elements, the cavities being situated in line with a zone of engagement of the two elements one with the other in which tightness is desired; and a flexible body secured to the element receiving the resilient members, provided with two free ends, the free ends extending at least in line with the engagement zones and being in contact with the resilient members.

According to the invention, each of the resilient members is capable of exerting a contact force on the free ends in order to ensure tightness between the two elements.

In other words, to ensure tightness between the first and second elements, and particularly of an enclosure, the invention proposes using resilient members and a flexible body fastened to the first element, the flexible body not being deformed in its mass, the deformation thereof being induced only by the resilient members.

Thus, in the operating position, in other words when the seal has to ensure tightness, the bearing force, which may result from a pressure difference, may be such that the free ends (or lips) of said seal may be rendered almost tangent to the surface of the engagement zone in which tightness is desired. The invention thus proposes using an ancillary member to exert a contact force locally in order to keep the seal flat, thereby increasing the seal contact surface.

This then gives a double lip seal capable for example of ensuring the tightness of two chambers.

The flexible body may be constituted by a metal blade or may come in an annular shape, and typically be a washer with a hole at its center.

If it comes in an annular shape, the flexible body may be secured to the element receiving the resilient members in its central part, and the free ends may be formed by the edges diametrically opposite relative to the central fastening point.

Each of the resilient members may be constituted by a ring-shaped spring.

To the advantage, the flexible body is secured to one of the elements using a fastening means, for example an adhesive, or a weld, or a screw. Depending on the fastening means used, the flexible body may be removable or non-removable away from said element receiving the resilient members.

Another object of the invention is a device for the hybridization of components by weld beads including at least:
- an upper block including an internal chamber capable of receiving a component for hybridization on a support plate using weld micro-beads, and an external chamber on the periphery of the internal chamber and separated therefrom by a wall internal to the upper block, and an external wall on the periphery of the external chamber;
- means for bringing the support plate into thermal contact with a heating element, after the heating element has reached a certain fusion temperature;
- means for uncoupling the support plate from the heating element, after the substrate is heated.

According to the invention, the support plate is fitted with a seal as described above, the resilient members of the seal each being accommodated in a cavity provided in the support plate, the secured portion of the flexible body being situated opposite the external chamber, and the free ends of the flexible body being positioned opposite the internal wall and external wall respectively at which point tightness is desired.

In other words, in the operating position, the free ends of the seal are pinned against the support plate, which may be constituted by a substrate, and only the resilient members exert a contact force on the free ends to ensure the tightness of the upper block. By making these free ends parallel to the contact surface of the support plate with the upper block, tightness is facilitated and the contact surface is maximized.

The invention thus ensures the tightness of a first zone, in this case the external chamber, but also creates a second hermetic zone, in this case the internal chamber.

To this advantage, the free ends sustain a bearing force, of the internal wall and external wall respectively of less than 60 newtons per linear millimeter of the seal. These bearing forces result at least from a pressure difference between the internal and external chambers or between the external chamber and the environmental pressure in which the device is placed.

According to one embodiment, the internal chamber is under vacuum.

According to another embodiment, the internal chamber is placed under a controlled atmosphere and the external chamber is under vacuum.

BRIEF DESCRIPTION OF THE DRAWINGS

Other characteristics and advantages of the invention will become clearer from the following description, given for information purposes and in no way restrictively, with reference to the appended drawings, wherein.

DESCRIPTION OF THE PREFERRED EMBODIMENTS

Figure 1A:
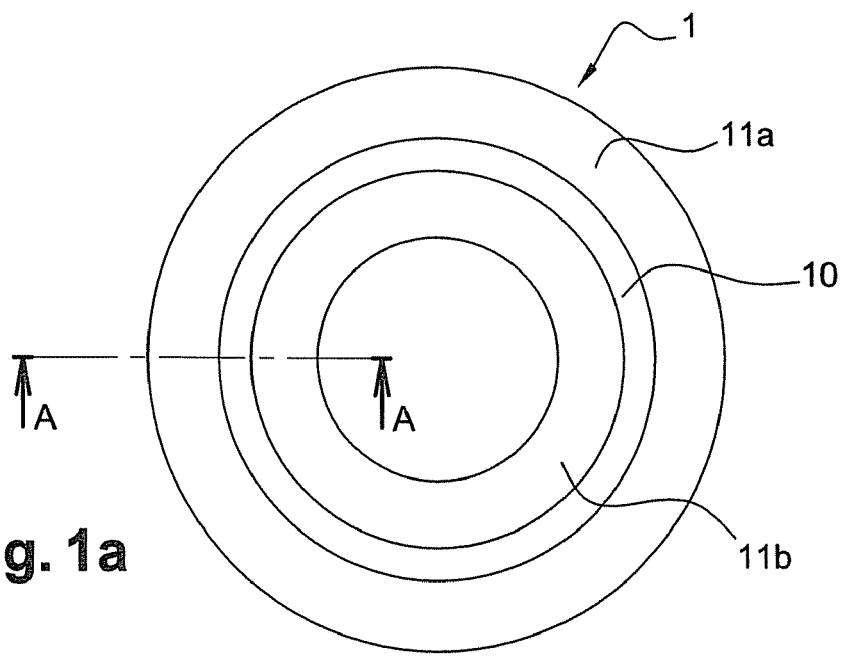
FIG. 1a is a diagrammatic representation of a double lip seal seen from above according to one inventive embodiment.
Figure 1B:
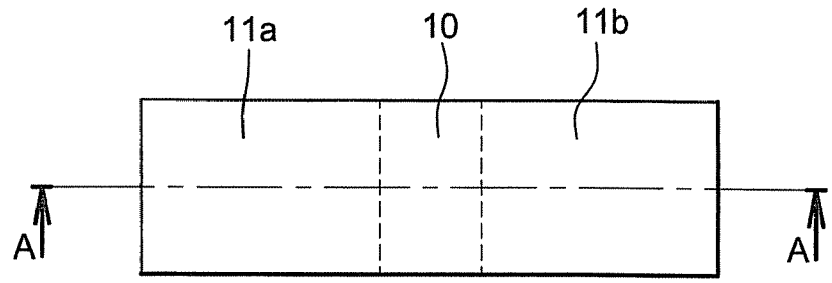
FIG. 1b is a diagrammatic representation of a double lip seal seen from above according to another inventive embodiment.
Figure 2:
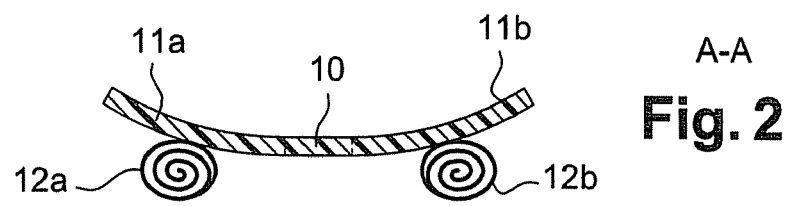
FIG. 2 is a cross-section view of a double lip seal according to FIG. 1a or 1b.

With reference to FIGS. 1a, 1b and 2, a double lip metal seal for ensuring tightness between two elements, hereinafter referred to as first and second elements in the interests of easier understanding, includes:
- a first resilient member 12a, for example a ring-shaped spring, intended to be accommodated in a first cavity of the first element;
- a second resilient member 12b, for example a ring-shaped spring, intended to be accommodated in a second cavity of the first element; and
- a flexible body 1 secured to the first element by a portion 10, and including:
  - a first free end 11a forming a first lip, offering a lower surface in contact with the first resilient member 12a, and an upper surface opposite the lower surface intended to be brought into contact with the second element, and
  - a second free end 11b forming a second lip, offering a lower surface in contact with the second resilient member 12b, and an upper surface intended to be brought into contact with the second element.

The first and second resilient members 12a, 12b, are capable of exerting a contact force on the first and second ends 11a, 11b respectively, to ensure tightness.

The flexible body 1 may be a rectangular metal blade, as shown in FIG. 1b, or of annular washer shape, as shown in FIG. 1a.

Figure 3:
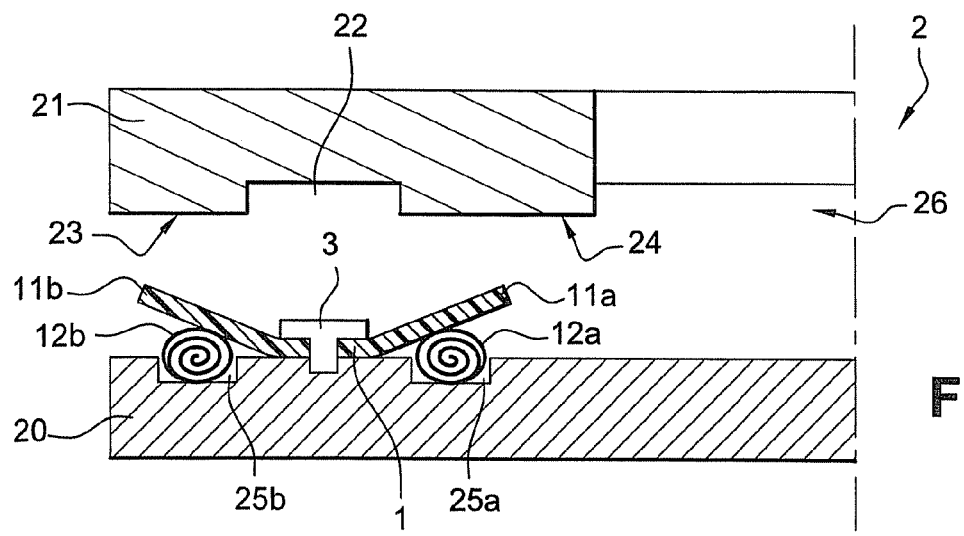
FIG. 3 is a partial diagrammatic representation of a unit fitted with a double lip seal before contact with the upper block of the unit according to one inventive embodiment.
Figure 4:
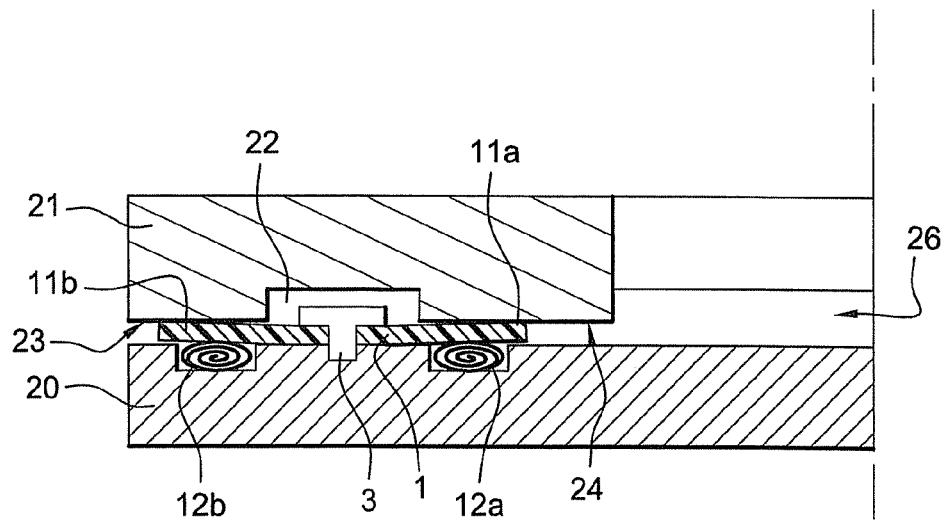
FIG. 4 is a partial diagrammatic representation of a unit fitted with a double lip seal after contact with the upper block of the unit according to one inventive embodiment.

The operation of this seal will now be explained in the context of a unit as described in the document U.S. Pat. No. 5,968,389, with reference to FIGS. 3 and 4.

The hybridization unit 2 or device includes an upper block 21, for example a bell-jar, including an internal chamber 26 capable of receiving a component for hybridization on a support plate 20, for example a substrate, using weld micro-beads, an external chamber 22 on the periphery of the internal chamber 26 and separated from the internal chamber 26 by an internal wall 24 of the upper block 21, and an external wall 23 on the periphery of the external chamber 22.

The support plate 20 is fitted with the double lip seal, the first resilient member 12a being accommodated in a first cavity 25a of the support plate 20, and the second resilient member 12b being accommodated in a second cavity 25b of the support plate 20.

The double lip seal is secured to the support plate 20 by a fastening means 3 placed opposite the external chamber 22. The first free end 11a is placed opposite the lower surface of the internal wall 24, and the second free end 11b is placed opposite the external wall 23.

In this embodiment, the seal ensures the tightness of a first zone, in this case the external chamber 22, but also creates a second hermetic zone, in this case the internal chamber 26, between the two lips of the seal. For example, the internal chamber 26 is under a controlled atmosphere and the external chamber 22 is under vacuum.

The support plate 20 is taken up and secured to the upper block 21 by the dint (i.e., force) of the vacuum established between the two lips. A vacuum control valve may be provided for example in order to produce a vacuum in the external chamber 22, as may a gas control valve in order to introduce a gas into the internal chamber 26, in order to provide a controlled atmosphere therein.

The double lip seal may be implanted in the following way:
- a flexible body 1 is cut out of a thin metal sheet to give for example a metal ring;
- the flexible body 1 is bored with clearance holes for screws over an intermediate diameter for subsequent fastening to the support plate 20, so that the flexible body 1 can be removed from the support plate 20;

two perfectly calibrated springs are produced designed to press for example against the lower zone of the two diametrically opposite ends of the cut ring;

these springs are inserted into holding grooves made on the support plate;

the flexible body is fastened to the support plate using screws and the clearance holes made therein, the diametrically opposite external edges of the flexible body being lifted through the forces exerted by the springs.

In every case, a recess may be provided on the upper block 21 opposite the fastening means 3, whatever fastening means is employed, whether by welding, bonding or mechanical fastening. Depending on the fastening means, the seal may of course be removable or non-removable.

The metal lip seal of the invention is used in particular in units that employ techniques for creating a self-sustained vacuum in an enclosure, for example in units that require both the repeated establishment of a high vacuum and a rapid rise to a high temperature, or again in units allowing the vacuum and high temperature welding of a cover by a seal.

The metal lip seal of the invention may for example be used in the following conditions:

minimum temperature: 400° C.

minimum period of exposure to said temperature: 30 seconds repeated 1,000 times maximum bearing force: 5 N/mm The invention thereby allows units to be produced that are able to operate under vacuum at very high temperatures. The invention may for example be implemented for a vacuum welding machine assembly chamber requiring a rise in temperature above 320° C., for a vacuum plasma etching machine chamber, or for a vacuum metal layer deposition machine, or any other type of machine that needs a high temperature resistant seal with the requirement for a reduced bearing force on the seal. The bearing force may for example be appreciably less than 60 N/mm, a value above which a prior art metal seal is sufficient.

It applies in particular to the field of high vacuum production devices, as well as to the more specific field of weld bead production during the production of electronic or optoelectronic components.

The invention claimed is:

1. A metal lip seal capable of ensuring tightness between two electronic or electro-optic elements, including:

two resilient members each intended to be accommodated in cavities of a first element of the two elements, said cavities being located in line with zones of engagement of a second element of the two elements in which said tightness between the two elements is desired; and a flexible body provided with two lip forming free ends and a central part located between the free ends, wherein the flexible body is fastened to the first element via the central part, said free ends extending from the central part at least in line with said engagement zones and being in contact with the resilient members;

each of the resilient members being capable of exerting a contact force on the free ends towards the second element to ensure tightness between the two elements.

2. The lip seal as claimed in claim 1, wherein the resilient members are ring-shaped springs.

3. The lip seal as claimed in claim 1, wherein the flexible body is constituted by a metal blade of rectangular shape.

4. The lip seal as claimed in claim 1, wherein the flexible body is constituted by a washer pierced at its center.

5. The lip seal as claimed in claim 1, wherein the flexible body is fastened using one of an adhesive, a weld, or a screw.

6. A device for the hybridization of components by weld beads including at least:

an upper block including an internal chamber capable of receiving a substrate for hybridization on a support plate by weld micro-beads, and an external chamber on the periphery of the internal chamber and separated from the internal chamber by a wall internal to the upper block, and an external wall on the periphery of the external chamber;

wherein the support plate is brought into thermal contact with a heating element, after the heating element has reached a certain fusion temperature;

wherein the support plate is decoupled from the heating element, after the substrate is heated;

wherein the support plate is fitted with a seal as claimed in claim 1, the resilient members of said seal being accommodated in a cavity of said support plate, the portion of the flexible body secured to the support plate being opposite the external chamber, and said free ends of the seal being opposite the internal wall and the external wall respectively at which point tightness is desired.

7. The device as claimed in claim 6, wherein said free ends are subjected to a bearing force of the internal wall and the external wall respectively less than 60 newtons per linear millimeter of seal, said bearing force resulting at least from a pressure difference between the internal and external chambers and between the external chamber and the environment in which said device is placed, respectively.

8. The device as claimed in claim 6, wherein the internal chamber is under vacuum.

9. The device as claimed in claim 7, wherein the internal chamber is under a controlled atmosphere and in that the external chamber is under vacuum.

10. An electronic or electro-optic device comprising:

two electronic or electro-optic elements;

a metal lip seal ensuring tightness between said two elements, including:

two resilient members accommodated in cavities of a first element of the two elements, said cavities being located in line with zones of engagement of a second element of the two elements in which said tightness between the first and second element is desired; and a flexible body provided with two lip forming free ends, and a central part located between the free ends, wherein the flexible body is fastened to the first element at the central part, said free ends extending from the central part at least in line with said engagement zones and being in contact with the resilient members;

each of the resilient members exerting a contact force on the free ends towards the second element to ensure tightness between the two elements.

* * * * *